United States Patent [19]

Yamagishi et al.

[11] Patent Number: 4,956,153
[45] Date of Patent: Sep. 11, 1990

[54] APPARATUS FOR CZOCHRALSKI SINGLE CRYSTAL GROWING

[75] Inventors: Hirotoshi Yamagishi; Izumi Fusegawa; Shuuji Yokota; Takao Abe, all of Gunma, Japan

[73] Assignee: Shin-Etsu Handotai Co., Ltd., Tokyo, Japan

[21] Appl. No.: 242,414

[22] Filed: Sep. 9, 1988

[30] Foreign Application Priority Data

Sep. 11, 1987 [JP] Japan .................. 62-227922

[51] Int. Cl.$^5$ .............. C30B 15/30; C30B 15/20; C30B 29/06; C30B 35/00
[52] U.S. Cl. .................. 422/249; 422/245; 156/617.1; 156/620.4; 156/DIG. 64
[58] Field of Search ............... 156/618.1, 617.1, 620.4, 156/DIG. 64; 422/245, 249

[56] References Cited

U.S. PATENT DOCUMENTS

| | | |
|---|---|---|
| 3,206,286 | 9/1965 | Bennett et al. .................. 422/249 |
| 3,265,469 | 8/1966 | Hall .................. 422/249 |
| 3,511,610 | 5/1970 | Dohmen .................. 422/249 |
| 4,330,361 | 5/1982 | Kuhn-Kohnenfeld et al. .................. 156/620.4 |
| 4,330,362 | 5/1982 | Zulehner .................. 156/617.1 |
| 4,378,269 | 3/1983 | Matsushita et al. .................. 156/620.4 |
| 4,686,091 | 8/1987 | Washizuka et al. .................. 422/249 |

FOREIGN PATENT DOCUMENTS

| | | | |
|---|---|---|---|
| 0229322 | 7/1987 | European Pat. Off. .......... | 156/617.1 |
| 2821481 | 11/1979 | Fed. Rep. of Germany ... | 156/617.1 |
| 2139918A | 11/1984 | United Kingdom .............. | 156/617.1 |

*Primary Examiner*—Gary P. Straub
*Attorney, Agent, or Firm*—Wenderoth, Lind & Ponack

[57] ABSTRACT

An improved apparatus for growing a single crystal of semiconductor silicon by the Czochralski method which apparatus has a heat-resistant and heat-insulating covering board in direct contact with the upper ends of heat-insulating members surrounding a quartz glass silicon melting crucible and having a circular center opening, and a heat-resistant and heat-insulating tube having an outer diameter approximately equal to the diameter of the center opening in the covering board gas-tightly joined to an upwardly extending argon gas supplying conduit and extending downwardly from the joint of the top wall of a metal housing and the upwardly extending conduit and extending through the center opening in the covering board in such a manner that the single crystal during growing is coaxially surrounded thereby, the lower end thereof being at a height above and in the proximity of the surface of the melt in the crucible. The wafers cut from the silicon single crystal grown in the apparatus are substantially free of defects such as OISFs after a thermal oxidation treatment.

6 Claims, 4 Drawing Sheets

APPARATUS FOR CZOCHRALSKI SINGLE CRYSTAL GROWING

BACKGROUND OF THE INVENTION

The present invention relates to an improvement in an apparatus for single crystal growing by the Czochralski method. More particularly, the invention relates to an improvement in an apparatus for growing single crystals of high-purity semiconductor silicon by the Czochralski method by which high-quality single crystals of semiconductor-grade silicon can be produced with remarkably decreased costs.

As is well known, semiconductor single crystals or, in particular, single crystals of high-purity semiconductor silicon are produced either by the so-called Czochralski method or the so-called floating zone-melting method, of which the major trend in the modern technology for the production of silicon single crystals used in the manufacture of integrated circuits is to use the former Czochralski method in which a single crystal of silicon is pulled up from a melt of silicon by using a seed crystal.

Figure 3:
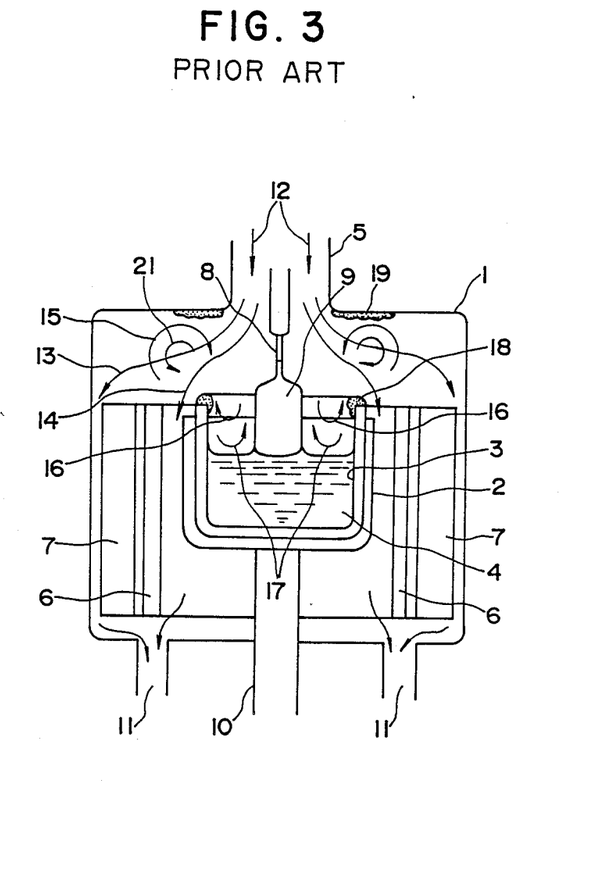
FIGS. 3 and 4 are each a schematic vertical cross-section of a prior art apparatus.

In a typical apparatus conventionally used for the Czochralski single crystal growing of semiconductor silicon illustrated in FIG. 3 of the accompanying drawing by a vertical cross section, the quartz glass-made crucible 3 containing the melt of silicon 4 is placed in a metal-made housing 1 of the crystal-growing chamber and the atmosphere inside the chamber 1 is filled with a flowing stream of argon gas shown by the flow lines 12, 13, 14, 16, 17 from the upper conduit 5 on the housing 1 toward the exhaust discharge ports 11 at the bottom of the housing 1. Therefore, the atmosphere of the crystal growing chamber inside the metal-made housing 1 should ideally consist of high-purity argon gas. The fact is that the atmospheric argon gas of the crystal growing chamber is contaminated with various kinds of contaminants including silicon monoxide formed by the reaction of the quartz glass-made crucible 3 and the melt of silicon 4, moisture and oxygen desorbed from the graphite-made parts and components such as the graphite-made receptacle 2, graphite-made heater elements 6, heat-insulators 7 made of a felt of graphite fibers and the like as well as carbon monoxide and carbon dioxide formed by reaction of the moisture and oxygen with the graphite surface heated at a high temperature, e.g., exposed surfaces of graphite-made heater elements 6 and graphite-made receptacle 2, silicon monoxide formed by the reaction of the moisture and oxygen with the melt of silicon 4, carbon monoxide and/or silicon monoxide formed by the reaction of the silicon dioxide of the crucible 3 with the graphite-made receptacle 2 in contact therewith, and so on. Contamination of the atmospheric argon gas with these contaminants is very detrimental to the crystalline structure of the single crystal and increase of the carbon content in the single crystal as grown. Although carbon is an element belonging to the same group as silicon in the Periodic Table and is considered to be electrically inactive, contamination of a silicon single crystal with carbon in fact causes degradation of the electrical properties of semiconductor devices manufactured from such a contaminated single crystal. When the content of carbon in a semiconductor silicon single crystal exceeds 0.5 ppm atomic, for example, the semiconductor devices prepared from such a single crystal may suffer from a decrease in the breakdown voltage of the p-n junction. Accordingly, it is an important technical problem to decrease the carbon content in a semiconductor silicon single crystal used as a material of semiconductor integrated circuits.

The sources of the oxygen and moisture as the contaminants contained in the argon gas of the crystal-growing atmosphere inside the metal-made housing 1 are not limited to the graphite-made structures above mentioned. In the preparatory stage before the start of the Czochralski single crystal growing of a semiconductor silicon from a melt of silicon, the graphite-made parts should be first subjected to a bake-out treatment for a length of time at a higher temperature than in the following actual crystal pulling-up process with the object being to refine the graphite materials by removing the absorbed moisture and oxygen. A problem in this prepartory work is that the bake-out treatment cannot economically be done successfully due to the slowness of desorption from the inside of the graphite materials. Besides, even argon gas of the highest-purity grade available is not absolutely free from various impurities and further the gases initially present in the nooks and recesses in the crystal-growing chamber may more or less remain therein and not be replaced with the argon gas. Therefore, it is not rare that the argon gas of the crystal growing atmosphere is contaminated with moisture and oxygen as problem causing contaminants which cause disorders or other adverse effects in the crystalline structure of the silicon single crystal grown in the atmosphere.

The gaseous silicon monoxide vaporized mainly from the melt of silicon 4 in the crucible 3 is carried away and brought upwardly by the argon gas stream flowing along the complicated flow lines 16, 17 and deposited in the form of a laminar or bulky deposit 18, 19 on the upper periphery of the crucible 3 or the lower surface of the ceiling part of the metal-made housing 1 at a relatively low temperature. The deposite 18, 19 of silicon monoxide once formed in the above described manner may sometimes subsequently fall down to the surface of the melt of silicon 4 and, before being dissolved therein, reach the solid-liquid interface of the growing single crystal 9 by being carried by the surface flow of the melt of silicon 4 which is caused by the convection current or the rotation of the crucible 3, resulting in disorders in the crystalline structure of the single crystal 9.

Moreover, the stream lines of the argon gas flowing in the crystal-growing atmosphere are rarely so simple as schematically expressed by the flow lines 12, 13, 14 in FIG. 3 during the progress of crystal pulling-up but usually involve complicated turbulent flows as shown by the flow lines 15, 16, 17 and 21 to further enhance deposition of silicon monoxide.

It has been proposed in Japanese Patent Kokai 55-113695 as a way to prevent falling of dust of the silicon monoxide from the deposits down to the surface of the melt of silicon 4 that a protector be provided inside the crystal-growing chamber of the apparatus to cover the crucible 3, heater elements 6 and heat-insulating members 7. Alternatively, Japanese Patent Kokai 57-123890 discloses an apparatus in which an orificed gas-flow rectifying baffle is provided close to the quartz glass crucible which serves to rectify the gas flow to promote discharge of the silcon monoxide.

These prior art improvements in the structure of the crystal pulling-up apparatuses are not satisfactory. Accordingly, it is eagerly desired to develop an improved apparatus for single crystal pulling-up by the Czochralski method for the preparation of single crystals of semiconductor silicon which can be operated without the above described problems due to the deposition of silicon monoxide.

It is also known that, when electronic devices constituted by integrated circuits are formed on a wafer of a silicon single crystal in a high density of integration in a process involving a step of thermal oxidation, line defects, referred to as OISFs hereinafter, are induced by the thermal oxidation and act to greatly degrade the performance of the electronic devices together with other microscopic crystalline defects resulting in a decrease in the yield of acceptable products, while control of the OISFs is almost impossible in the conventional apparatuses. Although no clear understanding has yet been obtained of the mechanism leading to the occurrence of OISFs, it is known that OISFs can be classified into two types depending on the modes of occurrence thereof into type A OISFs and type B OISFs. The type A OISFs occur in the outer peripheral portion of about 5 mm width around the single crystal. The distribution density of the type A OISFs in the defective region usually exceeds 20,000/cm$^2$ on an average with a clear demarcation with the region inside the single crystal free from the type A OISFs.

On the other hand, the type B OISFs are distributed in a density equivalent to or lower than that of the type A OISFs throughout the region from the axis of the single crystal to just inside of the region of the type A OISFs. Increase of the pulling-up velocity of the single crystal is a way to prevent occurrence of the type A OISFs but no effective means has yet been developed to prevent occurrence of the type B OISFs.

SUMMARY OF THE INVENTION

The first object of the present invention is therefore to provide an improved apparatus for single crystal growing of semi-conductor silicon by the Czochralski method in which an effective means is provided for preventing occurrence of disorders in the crystalline structure of the single crystal caused by falling of dust of silicon monoxide down to the surface of the melt of silicon in the crucible from the deposit on the upper periphery of the quartz glass-made crucible and the lower surface of the ceiling portion and side walls of the metal-made housing of the crystal-growing chamber by controlling or suppressing the deposition of silicon monoxide thereon.

Another object of the invention is to provide an improved apparatus for single crystal growing of semiconductor silicon by the Czochralski method in which an effective means is provided for decreasing contamination of the melt of silicon contained in the crucible with carbon as a result of contacting with carbon monoxide gas unavoidably produced by the reaction of the graphite-made parts and components such as the receptacle, heater elements and heat-insulating members with the gaseous constituents absorbed on or absorbed in these graphite-made parts by using a gas flow-rectifying means for the atmospheric gas inside the quartz glass-made crucible.

A further object of the invention is to provide an improved apparatus for single crystal growing of semiconductor silicon by the Czochralski method in which the single crystal of silicon can be grown at a greatly increased pulling-up velocity by shielding the heat of radiation from the melt of silicon and from the heater elements and by forcibly cooling the single crystal during growing with the atmospheric gas as a cooling medium.

A still further object of the invention is to provide an improved apparatus for single crystal growing of semiconductor silicon by the Czochralski method which can be used for growing a silicon single crystal with little occurrence of OISFs affecting the quality of the semiconductor devices manufactured from the silicon single crystal.

Thus, the present invention provides an improvement in an apparatus for growing a sigle crystal of semiconductor silicon by the Czochralski method which apparatus has a graphite-made receptacle for holding a quartz glass-made crucible containing a melt of silicon, a shaft to rotate the graphite-made receptacle around a vertical axis, graphite-made heater elements surrounding the graphite-made receptacle, heat-insulating members surrounding the heater elements, a metal-made housing enclosing the receptacle, the rotating shaft, the heater elements and the heat-insulating members and having an opening in the top wall thereof, and a conduit gas tightly jointed to the opening in the top wall of the housing and extending upwardly, the improvement comprising:

(A) a heat-resistant and heat-insulating covering board in direct contact with the upper ends of the heat-insulating members and having a circular center opening; and (B) a heat-resistant and heat-insulating cylindrical tube having an outer diameter approximately equal to the diameter of the center opening in the covering board of the component (A) gas tightly jointed to the upwardly extending conduit and extending downwardly from the joint of the top wall between the metal-made housing and the upwardly extending conduit extending through the center opening in the covering board of the component (A) in such a manner that the single crystal is coaxially surrounded thereby, as the crystal is grown the lower end thereof being at a height above and in the proximity of the surface of the melt in the quartz glass-made crucible.

DETAILED DESCRIPTION OF THE PREFERRED EMBODIMENTS

Figure 1:
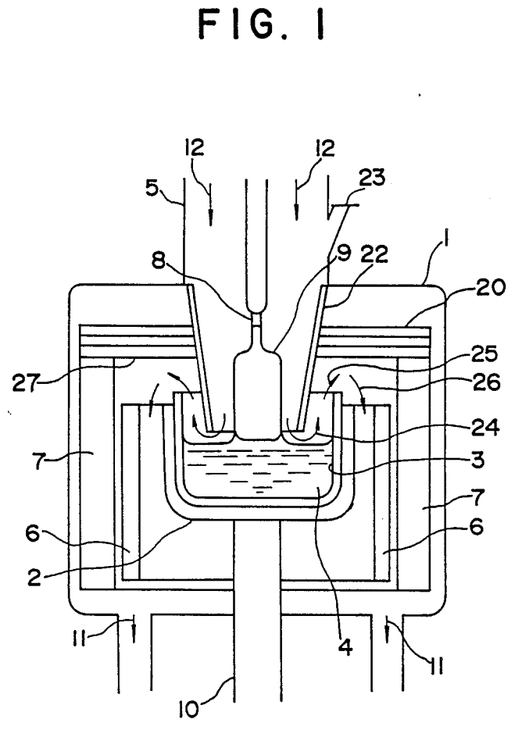
FIG. 1 is a schematic vertical cross-section of the apparatus according to the invention.

As is described above, the characteristic features of the invention, making reference to FIG. 1 of the accompanying drawing, consist in the improvement which comprises, in an apparatus for growing a single crystal of semiconductor silicon by the Czochralski method and having a graphite-made receptacle 2 for holding a quartz glass-made crucible 3 containing a melt of silicon 4, a shaft 10 to rotate the graphite-made receptacle 2 around a vertical axis, graphite-made heater elements 6 disposed so as to surround the graphite-made receptacle 2, heat-insulating members 7 surrounding the heater elements 6, a metal-made housing 1 enclosing the receptacle 2, the rotating shaft 10, the heater elements 6 and the heat-insulating members 7 and having an opening in the top wall thereof, and a conduit 5 gas tightly connected to the top wall of the housing 1 around said opening and extending upwardly, which comprises:

(A) a heat-resistant and heat-insulating covering board 20 in direct contact with the upper ends of the heat-insulating members 7 and having a circular center opening; and (B) a heat-resistant and heat-insulating cylindrical tube 22 having an outer diameter approximately equal to the diameter of the center opening in the covering board 20 of the component (A) gas-tightly connected to the upwardly extending conduit 5 and extending downwardly from the joint of the top wall of the metal-made housing 1 and the upwardly extending conduit 5 and extending through the center opening in the covering board 20 of the component (A) in such a manner that the single crystal 9 during growing is coaxially surrounded thereby, the lower end thereof being at a height above and in the proximity of the surface of the melt 4 in the quartz glass-made crucible 3.

It is preferable in the above described apparatus that the distance between the lower surface fo the heat-resistant and heat-insulating covering board 20 and the surface of the melt 4 in the crucible 3 be in the range from 200 mm to 400 mm and the distance between the lower end of the heat-resistant and heat-insulating cylindrical tube 22 and the surface of the melt 4 in the crucible 3 be in the range from 5 mm to 30 mm. The inner diameter of the heat-resistant and heat-insulating cylindrical tube 22 is preferably larger by at least 10 mm than, but does not exceed twice the outer diameter of the single crystal 9 to be grown in the apparatus.

Further, each of the heat-resistant and heat-insulating covering board 20 and the heat-resistant and heat-insulating cylindrical tube 22 has a thickness in the range from 5 mm to 50 mm and is preferably made of graphite optionally provided with a coating layer of a refractory material such as silicon nitride or silicon carbide.

As is illustrated in FIG. 1, a quartz glass-made crucible 3 is held at about the center of the metal-made housing 1, which is water-cooled, by a graphite-made receptacle 2 which fits with the crucible 3 at the side walls and at the bottom. The receptacle 2 is supported at the bottom center by the upper end of the rotating shaft 10. Heat-insulating members 7 made, for example, of a felt of graphite fibers coaxially surround the graphite-made receptacle 2 with a space therebetween.

The top wall of the metal-made housing 1 has a center opening through which a rotatable shaft or wire for holding a seed crystal 8 at the lower end thereof hangs down to the crystal growing chamber. A conduit 5 is air-tightly connected to the center opening of the housing 1 to surround the above described rotatable seed-holding shaft or wire. The conduit 5 serves to enclose the single crystal 9 pulled while being grown from the melt 4 in the crucible 3. At the joint of the conduit 5 and the housing 1, a heat-resistant heat-insulating cylindrical tube 22 is connected to the housing 1 air-tightly extends downwardly. The tube 22 surrounds the single crystal 9 during growing coaxially. The lower end of the tube 22 is held at a height above the surface of the melt 4 of silicon in the crucible 3 making a narrow gap therebetween which should preferably be constant throughout the crystal growing process. The cylindrical tube 22 extends downwardly through the circular center opening of a heat-resistant and heat-insulating covering board 20. The outer diameter of the covering board 20 is approximately equal to that of the heat-insulating members 7 and the outer periphery of the covering board 20 is connected to or contacted with the horizontal upper end surfaces of the heat-insulating members 7 preferably gas tightly. The diameter of the center opening in this covering board 20 is preferably as close as possible to the outer diameter of the cylindrical tube 22 extending therethrough. The clearance between the periphery of the center opening in the covering board 20 and the outer surface of the cylindrical tube 22 preferably does not exceed 5 mm.

The lower end opening of the downwardly extending cylindrical tube 22 should naturally have an inner diameter larger than the diameter of the single crystal 9 pulled up therethrough and the inner diameter of the tube 22 should be larger by at least 10 mm than, but should not exceed twice the outer diameter of the single crystal 9.

It is very desirable that the covering board 20 be highly heat-insulating. In this connection, the covering board 20 should have a multilayered structure composed of the uppermost and lowermost layers sandwiching a layer of a felt of graphite fibers. In this regard, the covering board 20 should have a thickness in the range from 5 mm to 50 mm and the overall coefficient of thermal conductivity thereof should not exceed 20 kcal/m.hour.°C. on an average.

The covering board 20 should be installed at a height as close as possible to the surface of the melt 4 in the crucible 3 because it is an advantageous condition that the lower surface 27 of the covering board 20 be kept at a temperature as high as possible. It should be noted, however, that the height difference between the lower surface 27 of the covering board 20 and the upper periphery of the crucible 3 is in the range from 5 to 20 mm in the last stage of the process of single crystal pulling-up when the crucible 3 is in the highest position thereof as it has been gradually moved upwardly along with the decrease in the volume of the melt 4 remaining in the crucible 3.

In order that the above described requirements can be satisfied, the lower surface 27 of the heat-insulating covering board 20 should be at a height about 200 mm above the surface of the melt 4 of silicon in the crucible 3. The height difference, however, should not exceed 400 mm in order to keep the lower surfce 27 of the covering board 20 at a temperature of 1100° C. or higher. It is advantageous in this regard that the covering board 20 have a multilayered structure described above to decrease the overall coefficient of thermal conductivity in the direction of the thickness. Typically, the multilayered covering board 20 has three layers composed of the uppermost and lower most layers made of graphite as in the cylindrical tube 22 and the interposed layer is made of a material of a particularly low thermal conductivity such as a felt of graphite fibers sandwiched between the uppermost and lowermost layers. The layer formed of a felt of graphite fibers should not be exposed bare to the atmospheric gas because such a material is sometimes liable to produce carbonaceous dust.

Following is a description of the process of single crystal growing of semiconductor silicon by using the above described inventive apparatus. In the first place, blocks of high-purity polycrystalline silicon are charged into the quartz glass-made crucible 3 and the chamber is evacuated followed by introduction of argon gas to completely replace the air in the chamber with argon gas. Thereafter, electric power is supplied to the graphite-made heater elements 6 so as to melt the polycrystalline blocks of silicon to form a melt 4. The seed crystal 8 is gradually moved down until the lower end portion thereof is immersed in the melt 4 of silicon and then pulled up at a controlled rate while the electric power input to the heater elements 6 is exactly controlled so as to bring the melt 4 and the seed crystal 8 at a temperature equilibrium. It is usual that rotation of each of the crucible 3 and the seed crystal 8 is started at respective controlled velocities and in directions opposite to each other before the lower end of the downwardly moving seed crystal 8 is contacted with the surface of the melt 4.

It is essential that the atmosphere of the crystal growing chamber inside the housing 1 be filled with high-purity argon gas throughout the crystal growing process. The argon gas introduced at the upper end of the conduit 5 flows down along the path of arrows 12 in the conduit 5 and the downwardly extending cylindrical tube 22, which has a surface coating layer of a high-purity graphite of silicon carbide, through the space formed between the inner walls thereof and the growing single crystal 9. The argon gas having reached the lower end of the cylindrical tube 22 passes through the gap between the lower end thereof and the surface of the melt 4 and is discharged out of the crystal growing chamber 1 after flowing along the flow lines 24, 25, 26 and 11. The gap between the lower end thereof and the surface of the melt 4 has a width preferably in the range from 5 to 30 mm. The lower end opening of the cylindrical tube 22 has a diameter preferably larger by at least 10 mm than, but not exceeding 1.5 times the diameter of the single crystal 9 during growing.

As is described above, the ambient argon gas flows in the crystal growing chamber along the flow lines 24, 25, 26 and is downwardly discharged at the bottom of the chamber. It is important here that no turbulent flow of argon gas be formed in the space surrounded by the cylindrical tube 22, the surface of the melt 4 of silicon and the quartz glass-made crucible 3 so as to smoothly carry away the vapor of silicon monoxide produced on the surface of the melt 4 of silicon. In contrast to the crystal growing process using a conventional apparatus in which fine particles of silicon monoxide are deposited at the upper peripheral portion of the quartz glass-made crucible, deposition of fine particles of silicon monoxide can be greatly decreased or completely prevented in the inventive apparatus by virtue of the sufficiently high flowing velocity of the argon gas, sufficiently high temperature condition around the upper peripheral portion of the crucible 3 and smooth and non-turbulent flow lines of the argon gas without back-flow. Although the argon gas flowing along the line 25 is at least partly brought into contact with the lower surface 27 of the covering board 20 and the outer surface of the downwardly extending cylindrical tube 22, no or little deposition of silicon monoxide takes place on these surfaces because the surfaces are kept at a sufficiently high temperature by the heat of radiation from the surface of the melt 4 of silicon in the crucible 3. Even when a small amount of silicon monoxide deposit is formed by chance on these surfaces and eventually comes off, the falling dust of silicon monoxide is readily blown off by the gas flow exiting out of the lower end of the cylindrical tube 22 so as to be efficiently carried away out of the region where the dust may have a chance to fall on to the surface of the melt 4 at or in the vicinity of the interface between the single crystal 9 during growing and the surface of the melt 4 and the dust may be revaporized so as to cause no trouble.

In contrast to the crystal growing process using a conventional apparatus where contamination of the silicon single crystal as grown with carbon is more or less unavoidable, such a drawback can be completely prevented in the inventive apparatus because the carbonaceous contaminant material can be rapidly carried away by the flow of argon gas along the line 24, 25 and 26 at a sufficiently high flowing velocity without backflow. Despite the seeming possibility of contamination of the single crystal 9 with carbon, when the lower surface 27 of the covering board 20 and/or the outer or inner surface of the heat-resistant and heat-insulating cylindrical tube 22 are formed of a carbonaceous material such as graphite, this problem is of no significance in the inventive apparatus and the content of the carbonaceous contaminant in the single crystal as grown is far below the acceptable upper limit. It is of course more preferable that the above described surface layers are coated with a non-carbonaceous heat-resistant material such as silicon nitride, silicon carbide and the like.

In addition to the above described advantages, it is also possible in the inventive apparatus to greatly increase the velocity of pulling up of the single crystal during growing, thereby contributing to the improvement of the productivity. In contrast to the maximum pulling-up velocity of about 1.0 mm/minute in a conventional apparatus when a silicon single crystal having a diameter of 6 inches is grown, the pulling-up velocity can be doubled in some cases using the inventive apparatus.

The heat-resistant and heat-insulating cylindrical tube 22 can be an integral body having a thickness of 5 mm to 10 mm and made of graphite or, alternatively, it has a multilayered structure, like the covering board 20, composed of an outermost and inner-most layers made of graphite and an interposed layer formed of a felt of graphite fibers in order to increase the resistance against heat transfer from the inner surface toward the outer surface. Moreover, it is known that the velocity of pulling up of a single crystal can be increased by increasing the temperature gradient in the melt 4 of silicon at and in the vicinity of the interface with the growing single crystal by efficiently removing the heat from the interface, and such a purpose is served by the shielding effect of the heat of radiation from the surface of the melt 4 and the graphite-made heater elements 6 and by the cooling effect by means of the flowing argon gas.

Most importantly, the improved apparatus of the present invention is very advantageous in respect of the possibility of growing silicon single crystals of high quality having greatly decreased OISFs in addition to the above described various advantages. As was explained before, semiconductor substrates of silicon single crystal are always subject to the occurrence of OISFs due to the thermal oxidation in the course of the manufacturing process of semiconductor devices. Such a line defect and other microscopic defects formed on the surface of a silicon wafer after the thermal oxidation treatment greatly affect the electric properties of the semiconductor devices such as transistors formed in the vicinity of the surface of the silicon wafer particularly decreasing the yield of acceptable products in the manufacture of semiconductor elecronic circuit elements with a high density of integration.

A large number of reports are dedicated to the problem of preventing such a line defect on the surface of a semiconductor silicon wafer by a thermal oxidation treatment by means of investigations of the mechanisms leading to the defect including the microscopic mechanical strains on the wafer surface, agglomeration of the spot-wise defects in the course of the thermal oxidation treatment, contamination of the wafer surface with sodium and so on. It is also known that occurrence of line defects is influenced by the crystallographic orientation of the wafer of silicon single crystal and the frequency of occurrence thereof is larger in the [100] direction than in other orientations. According to the results of recent research as reported with particular attention to the microscopic defects caused by the oxygen contained in the silicon wafer, furthermore, the technology has been upgraded to such a level that an oxygen-depletion layer is formed intentionally on the surface of the silicon wafer by means of out-diffusion at a high temperature. In this manner, success has been obtained in greatly reducing the density of the line defects due to the thermal oxidation of the surface of the silicon wafer. It is a conclusion obtained by the experiments of the inventors, however, that those OISFs still occur at a high density on the surface of the silicon wafer depending on the structure of the crystal growing apparatus used for growing the silicon single crystal and/or the conditions for the crystal growing process affecting the characteristics of the electronic circuit constructed by using the semiconductor device and decreasing the yield of acceptable products.

Figure 5:
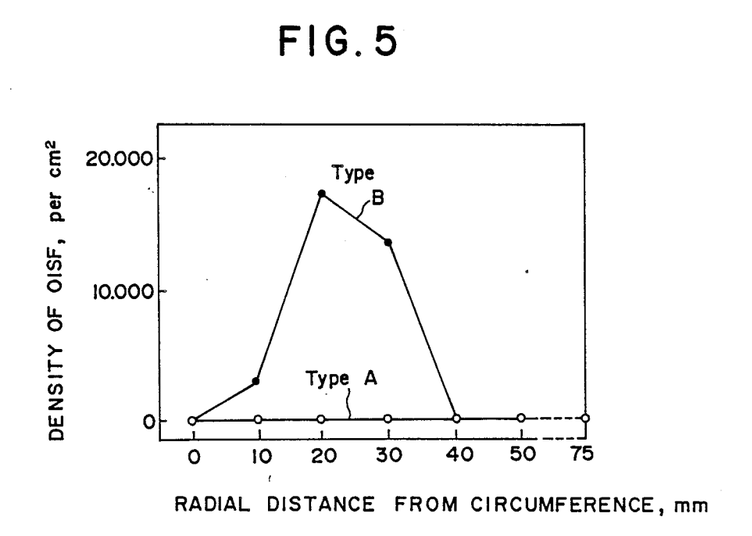
FIG. 5 is a graph showing the density of the OISFs on a silicon single crystal wafer obtained using a prior art apparatus as a function of the radial distance from the periphery.

The inventors also followed the teaching in the U.S. Pat. No. 4,330,362 and conducted experiments using the pot-like heat shield, and reached a conclusion that such a means had no controlling effect for preventing occurrence of the type B OISFs, although occurrence of the type A OISFs can be controlled by means of adjustment of the pulling-up velocity of the single crystal. FIG. 5 of the accompanying drawing shows the results of these experiments.

Figure 2:
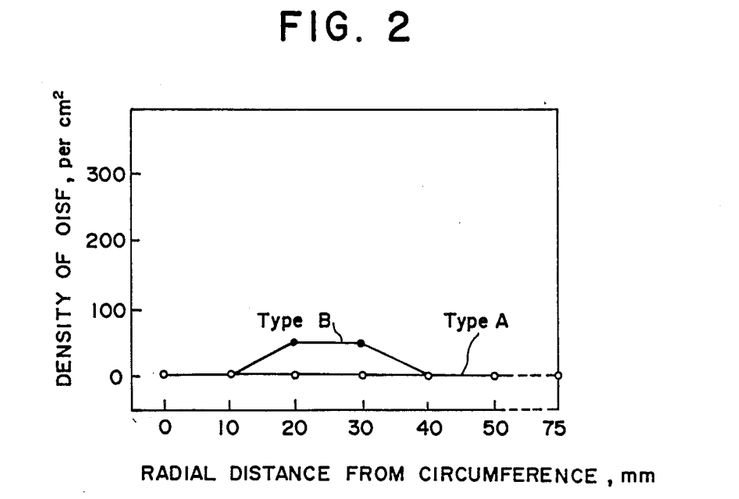
FIG. 2 is a graph showing the density of the OISFs on a silicon single crystal wafer obtained using the apparatus of the invention as a function of the radial distance from the periphery.

When the same experiments as above were repeated using the apparatus of the present invention, on the contrary, a single crystal could be grown with almost no occurrence of the type B OISFs or the density of the type B OISFs in the single crystal as grown was much smaller than in a single crystal grown by using the above described prior art apparatus. FIG. 2 shows the results of these experiments.

Although no detailed analysis has been undertaken of the mechanism leading to the formation and disappearance of the two types of the OISFs, a presumption described below is obtained from the fact that, while the type A OISᴿs no longer occur when the crystal pulling-up velocity is high either by using the pot-like heat shield of the prior art or by using the heat-resistant covering board 20 and the heat-resistant and heat-insulating cylindrical tube 22 according to the invention, a remarkable decrease can be achieved in the density of the type B OISFs simply by using the inventive apparatus.

When the crystal pulling-up velocity is high, for example, the temperature gradient in the direction of crystal pulling-up is relatively small so that occurrence of the type A OISFs can be prevented thereby. When the cooling rate of the single crystal rod during growing is increased to exceed a certain limit, on the other hand, the many point defects existing when the crystal is at the high temperature are trapped and frozen as such. When a silicon wafer prepared from such a single crystal containing a large number of frozen point defects is subjected subsequently to a thermal oxidation treatment, each of the point defects is grown to form a laminar defect. This could be the reason for the high density occurrence of the type B OISFs when the single crystal is grown by using the pot-like heat shield of the prior art. In contrast thereto, the inventive apparatus would be advantageous in this regard because the heat-resistant and heat-insulating cylindrical tube 22 surrounding the single crystal 9 during growing extends from the vicinity of the surface of the silicon melt 4 in the crucible 3 to the upper opening of the metal-made housing 1 through the heat-resistant and heat-insulating covering board 20 to make a direct contact with the joint of the housing 1 and the conduit 5 to effectively prevent occurrence of the type B OISFs. This situation can readily be understood when comparison is made between the conventional apparatus provided with the pot-like heat shield and the inventive apparatus. To explain it in more detail, the surface of a single crystal during growing in the apparatus disclosed in U.S. Pat. No. 4,330,362 is rapidly cooled when the portion of the single crystal as grown is pulled up above the pot-like heat shield by being exposed to the atmosphere surrounded by the metal-made housing and kept at a low temperature by means of a water-cooling jacket. This is presumably one of the reasons leading to the occurrence of the type B OISFs. In contrast thereto, a heat-shielding effect is obtained by means of a cylindrical tube made, for example, of graphite so as to avoid cooling down of the single crystal at such a high rate. The graphite-made heat-resistant and heat-insulating cylindrical tube 22 is also heated at a high temperature of 750° to 850° C. with the heat transferred from below. It would be a fair assumption that the cooling rate of a single crystal during growing may differ between the outer surface and the vicinity thereof and between the outer surface and the core portion of the crystal and the core portion is at a considerably higher temperature than the outer surface portion. In the apparatus provided with the pot-like heat shield as in the prior art, the portion of a single crystal during growing is subjected to rapid cooling as the portion comes above the heat shield possibly leading to the occurrence of the type B OISFs. The thermal stress caused inside the single crystal by such rapid cooling may be responsible for the occurrence of the type B OISFs.

Following is a description of the experiments undertaken in order to confirm the conclusion that the use of the inventive apparatus is effective for preventing occurrence of OISFs.

The structure of the crystal growing apparatus was generally as schematically illustrated in FIG. 1. A quartz glass-made crucible 3 having an inner diameter of 45 cm at the upper periphery was charged with blocks of polycrystalline silicon weighing 60 kg with a doping of phosphorus and the crucible 3 was mounted in the graphite-made receptacle 2. A heat-resistant and heat-insulating covering board 20 was mounted on the upper ends of the heat-insulating members 7 and the conduit 5 was closed. A heat-resistant and heat-insulating cylindrical tube 22 was put down from the upper portion of the conduit 5 through the circular opening in the heat-resistant and heat-insulating covering board 20 so as to be engaged with the protrusions on the inner wall of the conduit 5. Argon gas was introduced at the upper end of the conduit 5 at a rate of 50 liters/minute so as to keep the pressure inside the crystal growing chamber at 50 mb. The heater elements 6 were supplied with electric power to melt the polycrystalline blocks of silicon in the crucible 3 to form a melt 4 from which an n-type silicon single crystal rod having a diameter of 155 mm was pulled up in a crystallographic orientation of (100).

In the crystal growing run according to the invention, the inner walls of the heat-insulating members 7, lower surface of the heat-resistant and heat-insulating covering board 20 and the lower portion of the heat-resistant and heat-insulating cylindrical tube 22 facing the crucible 3 were kept at temperatures in the range from 1180° to 1250° C. and no deposition of silicon monoxide was found on these surfaces. Accordingly, no troubles were caused due to falling of the silicon monoxide dust into the crucible 3 so that the silicon single crystal grown in this manner had excellent properties.

Figure 4:
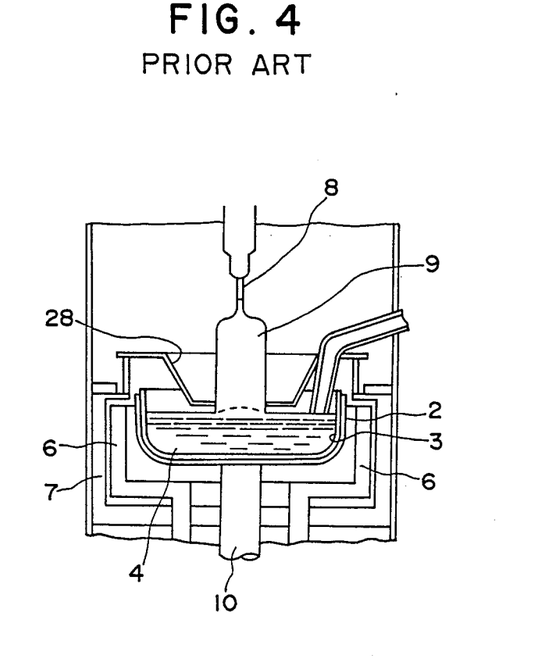

Separately, another crystal growing run was undertaken for comparative purpose in a similar manner to the above by using a molybdenum-made pot-like heat shield 28 disclosed in U.S. Pat. No. 4,330,362 and schematically illustrated in FIG. 4. In this case, a large amount of silicon monoxide was deposited on the lower surface of the annular rim of the molybdenum-made pot-like heat shield 28 which greatly disturbed the crystallization of silicon into a single crystal. The results of temperature measurement indicated that the lower surface of the annular rim of the molybdenum-made pot-like heat shield 28 was at a temperature of about 1050° C. which was lower by more than 100° C. than the lower surface of the heat-resistant and heat-insulating covering board 20. The great difference in the quality of the silicon single crystals may be explained by this large difference in the temperatures to support the conclusion as to the effectiveness of the heat-resistant and heat-insulating covering board 20 according to the invention.

Each of the silicon single crystals having an overall length of 110 cm grown in the above described manner was cut and sliced to give wafers of 0.75 mm thickness from positions at 10 cm intervals from the neighboring positions. The wafers after mirror-polishing were subjected to an oxidation treatment at 1150° C. in an oxidation furnace passing steam therethrough and, after cooling to room temperature, the oxide film on the surface was removed with hydrofluoric acid. Thereafter, the wafers were subjected to a selective etching treatment by dipping for 2 minutes in a Secco etchant and microscopically inspected for the occurrence of the type B OISFs. The results were that almost no OISFs could be detected on the wafers taken from the single crystal grown by using the inventive apparatus while the density of the type B OISFs was about 20,000/cm$^2$ on the wafers taken from the single crystal grown by using the prior art apparatus. The OISFs were found to be distributed in an annular region of about 30 mm width which was coaxial with the wafer surface with an outer diameter smaller by about 40 mm than the diameter of the wafer. This result supported the conclusion that the apparatus of the present invention was very effective in preventing occurrence of the type B OISFs on the surface of the silicon single crystal wafer subjected to an oxidation treatment. Furthermore, a specimen taken from the tail portion of the silicon single crystal grown in the inventive apparatus was analyzed by infrared absorption spectrophotometry for the content of carbon contaminant, and it was found that the content of carbon was below the detectable upper limit of 0.05 ppm.

What is claimed is:

1. An improved apparatus for growing a single crystal of semiconductor silicon by the Czochralski method, comprising:
   a graphite receptacle for holding a quartz glass crucible containing a melt of silicon;
   a shaft to rotate the graphite receptacle around a vertical axis;
   graphite heater elements disposed so as to surround the graphite receptacle;
   heat-insulating members surrounding the heater elements;
   a metal housing enclosing the receptacle, the rotating shaft, the heater elements and the heat-insulating members and having an opening in a top wall thereof;
   a conduit gas-tightly joined to the top wall of the housing to open into said opening and extending upwardly;
   a heat-resistant and heat-insulating covering board in direct contact with the upper ends of the heat-insulating members and having a circular center opening and heat-insulating covering board having a multilayered structure of an uppermost layer and a lowermost layer of graphite and an interposed layer of a felt of graphite fibers sandwiched between the uppermost layer and the lowermost layer; and
   a heat-resistant and heat-insulating graphite cylindrical tube having an outer diameter approximately equal to the diameter of the center opening in said covering board and gas-tighly joined to said upwardly extending conduit at the top wall of the metal housing and extending downwardly through the center opening in the covering board for axially surrounding a single crystal during growing thereof, the lower end of said tube being spaced above and in the proximity of the surface of the melt in the quartz glass crucible.

2. The improved apparatus as claimed in claim 1 wherein the distance between the lower surface of the heat-resistant and heat-insulating covering board and the surface of the melt in the crucible is in the range from 200 mm to 400 mm.

3. The improved apparatus as claimed in claim 1 wherein the distance between the lower end of the heat-resistant and heat-insulating cylindrical tube and the surface of the melt in the crucible is in the range from 5 mm to 30 mm.

4. The improved apparatus as claimed in claim 1 wherein the inner diameter of the heat-resistant and heat-insulating cylindrical tube is larger than the diameter of the single crystal during growing by at least 10 mm but does not exceed twice the diameter of the single crystal during growing.

5. The improved apparatus as claimed in claim 1 wherein the surface of the heat-resistant and heat-insulating covering board is provided with a coating layer having a thickness in the range from 5 mm to 50 mm and said coating layer being selected from the group consisting of, silicon nitride and silicon carbide.

6. The improved apparatus as claimed in claim 1 wherein the surface of the heat-resistant and heat-insulating cylindrical tube is provided with a coating layer having a thickness in the range from 5 mm to 50 mm and said coating layer being selected from the group consisting of, silicon nitride and silicon carbide.

* * * * *